US010312908B2

United States Patent
Freer et al.

(10) Patent No.: US 10,312,908 B2
(45) Date of Patent: Jun. 4, 2019

(54) NESTED MAGNETIC CONTROLS FOR INDUSTRIAL ENCLOSURES

(71) Applicant: Cooper Technologies Company, Houston, TX (US)

(72) Inventors: Benjamin Avery Freer, Syracuse, NY (US); Stephan P. Iannce, Clay, NY (US); Joseph Michael Manahan, Manlius, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 22 days.

(21) Appl. No.: 15/271,855

(22) Filed: Sep. 21, 2016

(65) Prior Publication Data
US 2017/0092447 A1   Mar. 30, 2017

Related U.S. Application Data

(60) Provisional application No. 62/233,485, filed on Sep. 28, 2015.

(51) Int. Cl.
*H01H 36/00* (2006.01)
*H03K 17/97* (2006.01)
*H01H 9/04* (2006.01)
*H01H 19/10* (2006.01)

(52) U.S. Cl.
CPC ............ *H03K 17/97* (2013.01); *H01H 9/042* (2013.01); *H01H 19/10* (2013.01); *H03K 2017/9713* (2013.01); *H03K 2217/94068* (2013.01)

(58) Field of Classification Search
CPC ............ H01H 36/0073; G05G 9/047; G05G 2009/04755

USPC ................................................ 335/205–207
See application file for complete search history.

(56) References Cited

U.S. PATENT DOCUMENTS

| | | | | |
|---|---|---|---|---|
| 4,101,857 A * | 7/1978 | O'Toole | ............... | H01H 36/006 335/206 |
| 5,369,386 A * | 11/1994 | Alden | ................... | H01H 9/042 335/206 |
| 5,581,179 A | 12/1996 | Engel et al. | | |
| 5,691,637 A | 11/1997 | Oswald et al. | | |
| 5,870,914 A * | 2/1999 | Dawson | ................... | E05B 37/00 340/5.55 |
| 6,201,388 B1 | 3/2001 | Pecheny et al. | | |
| 6,864,679 B2 * | 3/2005 | Yokoji | ..................... | H01H 5/02 200/404 |
| 6,912,137 B2 | 6/2005 | Berghegger | | |
| RE40,523 E * | 9/2008 | Miyata | ................... | G01D 5/145 123/406.52 |

(Continued)

FOREIGN PATENT DOCUMENTS

WO   WO1989/004014 A1   5/1989
WO     2006/107486 A2   10/2006

OTHER PUBLICATIONS

International Search Report and Written Opinion for Application No. PCT/US2016/053551 dated Jan. 5, 2017.

*Primary Examiner* — Bernard Rojas
(74) *Attorney, Agent, or Firm* — Merchant & Gould P.C.

(57) ABSTRACT

A system comprises an industrial enclosure, a first magnetic control and a second magnetic control. The industrial enclosure has a cover with an outer surface. The second magnetic control is nested within the first magnetic control, and the nested magnetic controls are secured to the outer surface of the cover of the enclosure.

31 Claims, 3 Drawing Sheets

(56) References Cited

U.S. PATENT DOCUMENTS

| | | |
|---|---|---|
| 7,825,537 B2 | 11/2010 | Freer |
| 8,120,453 B2 * | 2/2012 | Preaux ................ F21L 14/023 |
| | | 335/205 |
| 8,222,889 B2 | 7/2012 | Oberhoffner |
| 8,971,072 B2 | 3/2015 | Calvin et al. |
| 9,086,740 B2 * | 7/2015 | Furukawa ............ G06F 3/0338 |
| 9,214,304 B2 * | 12/2015 | Matsumoto .......... H01H 25/041 |
| 9,355,800 B2 | 5/2016 | Henderson |
| 9,728,358 B2 | 8/2017 | Henderson |
| 9,754,739 B2 * | 9/2017 | Honda ................. H01H 9/042 |
| 2004/0094393 A1 | 5/2004 | Lalonde et al. |
| 2005/0127902 A1 | 6/2005 | Sogge et al. |
| 2011/0120849 A1 * | 5/2011 | Morimoto ............ G06F 3/0338 |
| | | 200/5 A |
| 2012/0152381 A1 | 6/2012 | Ungerer et al. |
| 2012/0215475 A1 | 8/2012 | Rutledge et al. |
| 2012/0256821 A1 | 10/2012 | Olsson et al. |
| 2012/0274563 A1 | 11/2012 | Olsson |
| 2012/0287032 A1 | 11/2012 | Olssen |
| 2012/0306603 A1 | 12/2012 | Olsson et al. |
| 2013/0162268 A1 | 6/2013 | Pechstein et al. |
| 2014/0184367 A1 | 7/2014 | Liao |
| 2014/0232496 A1 | 8/2014 | Chang |
| 2014/0256188 A1 | 9/2014 | Manahan et al. |
| 2017/0094444 A1 | 3/2017 | Cameron |

* cited by examiner

NESTED MAGNETIC CONTROLS FOR INDUSTRIAL ENCLOSURES

CROSS REFERENCE TO RELATED APPLICATION

This application claims the benefit of U.S. Provisional Application No. 62/233,485, filed Sep. 28, 2015, which is incorporated herein by reference in its entirety.

FIELD OF THE DISCLOSURE

The present disclosure generally relates to industrial enclosures and, more specifically, to the incorporation of magnetic controls in industrial enclosures.

BACKGROUND OF THE DISCLOSURE

Industrial control systems are an important and necessary element in automating machinery and processes in industrial applications worldwide. Industrial control systems implement mechanical, hydraulic, pneumatic, and electrical controls as well as provide a user with a means to interface with these controls. The types of user interfaces can vary from a simple pushbutton to complex, computerized touch screens. Regardless of the type of user interface, each user interface must be presented to the user in an enclosure that is suitable to the environment in which the interface operates. As such, significant engineering work goes into designing enclosures that are not only appropriate to house a user interface but are also cost-effective to manufacture and maintain. Another important consideration of enclosure design is how to fit as many controls as possible into the smallest footprint while providing desired operability.

The many and varied types of industrial environments present different types of hazards and concerns. A major safety concern in dust laden industrial plants is the occurrence of fires and explosions. A source of energy is all that is needed to ignite an explosion when flammable gases or combustible dusts are mixed in the proper proportions with air. That source of energy can come from any number of sources within a plant environment however one area of particular concern is the plant's electrical installation which might include electrical components such as switches, circuit breakers, motor starter, pushbutton stations, or plugs and receptacles.

As such, the National Electric Code (NEC) has worked to establish a classification system to classify hazardous locations and to define standards for the types of electrical equipment that may be allowed into the hazardous location. The classes define the type of explosive or ignitable substances which are present in the atmosphere. Class I locations, those locations of particularly relevance to the present disclosure, are those in which flammable vapors and gases may be present. Class I is further subdivided into two divisions. Division 1 is a location in which ignitable concentrations of hazards exists under normal operation conditions and/or where hazard is caused by frequent maintenance or repair work or frequent equipment failure. Division 2 is a location in which ignitable concentrations of hazards are handled, processed or used, but which are normally in closed containers or closed systems from which they can only escape through accidental rupture or breakdown of such containers or systems.

With regard to the types of electrical equipment that may be allowed in a Class I, Division 1 or Division 2 location, the NEC noted that any type of conventional relay, contact, or switch that has an arcing contact must be enclosed in an explosion proof housing. The NEC has defined an Explosionproof Apparatus as an apparatus enclosed in a case that is capable of withstanding an explosion of a specified gas or a vapor that may occur within it and of preventing the ignition of a specified gas or vapor surrounding the enclosure by sparks, flashes, or explosion of the gas or vapor within, and that operates at such an external temperature that a surrounding flammable atmosphere will not be ignited thereby.

Thus, an explosion proof enclosure must prevent the ignition of an explosive gas or vapor that may surround it. In other words, an explosion inside the enclosure must be prevented from starting a larger explosion outside the enclosure. An explosion proof enclosure must further be of adequate strength and be "flame-tight." The term "flame-tight" does not imply that the enclosure is hermetically sealed but rather that the joints or flanges are held within narrow tolerances. These carefully machined joints cool the hot gases resulting from an internal explosion so that by the time they reach the outside hazardous atmosphere they are not hot enough to cause ignition.

Alternatively, intrinsically safe equipment may be used in a Class I, Division 1 or Division 2 location, wherein intrinsically safe equipment and wiring are incapable of releasing sufficient electrical or thermal energy under normal or abnormal conditions to cause ignition of a specific hazardous atmospheric mixture intis most easily ignited concentration.

The constraints around the types of enclosures that may be placed within a Class I, Division 1 or Division 2 location, must be addressed by the engineers designing and building the enclosure. Intrinsically safe barriers and complex flame paths require significant design and construction efforts at significant cost. Consequently, electrical control designs have focused on simplified push-buttons and simplified selector switches within explosion proof enclosures.

SUMMARY

A first aspect of the disclosure is directed to a system comprising an industrial enclosure, a first magnetic control and a second magnetic control. The industrial enclosure has a cover with an outer surface. The second magnetic control is nested within the first magnetic control, and the nested magnetic controls are secured to the outer surface of the cover of the enclosure.

Another aspect of the disclosure is directed to a system comprising an industrial enclosure a first rotatable magnetic control, a second rotatable magnetic control, and a plurality of sensors. The industrial enclosure has a cover with an outer surface. The first rotatable magnetic control is configured to emit a first magnetic flux density and the second rotatable magnetic control is configured to emit a second magnetic flux density. The second rotatable magnetic control is nested within the first rotatable magnetic control and the nested controls are secured to the outer surface of the cover of the enclosure. The plurality of sensors are contained within the industrial enclosure and are configured to sense the first and second magnetic flux densities. The sensed magnetic flux densities are representative of a position of the first rotatable magnetic control, the second rotatable magnetic control, or of both the first and second rotatable magnetic controls.

Still another aspect of the present disclosure is directed to a system comprising an industrial enclosure, a single-magnet control nested within a dual-magnet control, a sensor, and a programmable controller. The industrial enclosure has a cover with an outer surface. The nested magnetic controls are secured to this outer surface and are configured to emit magnetic flux density. The sensor is configured to sense the magnetic flux density. Further, the sensor is contained within the industrial enclosure and is configured to produce an output representative of the sensed magnetic flux density. The programmable controller is configured to operate on the output of the sensor to determine the position of at least one of the single-magnet control or the dual-magnet control and is configured to initiate a control operation based on the determined position.

The above summary is not intended to describe each embodiment or every implementation. A more complete understanding will become apparent and appreciated by referring to the following detailed description and claims in conjunction with the accompanying drawings.

DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure is directed to nested, magnetic controls that may be implemented in an industrial enclosure. The nested, magnetic controls provide multi-functional operation in a small foot print. When used with an explosion proof enclosure, within a Class I, Division 1 or Division 2 location, the nested, magnetic controls are able to provide significantly more functionality than the simplified, mechanical push-buttons and selector switches currently available for these locations. The multi-functional ability of the nested, magnetic controls increases the usability of the control interface yet requires little modification to the design of the enclosure in which they are implemented. It should be noted that, while the description below refers to example configurations comprising explosion proof enclosures, the nested, magnetic controls of the present disclosure may be implemented within any type of suitable industrial enclosure.

Figure 1:
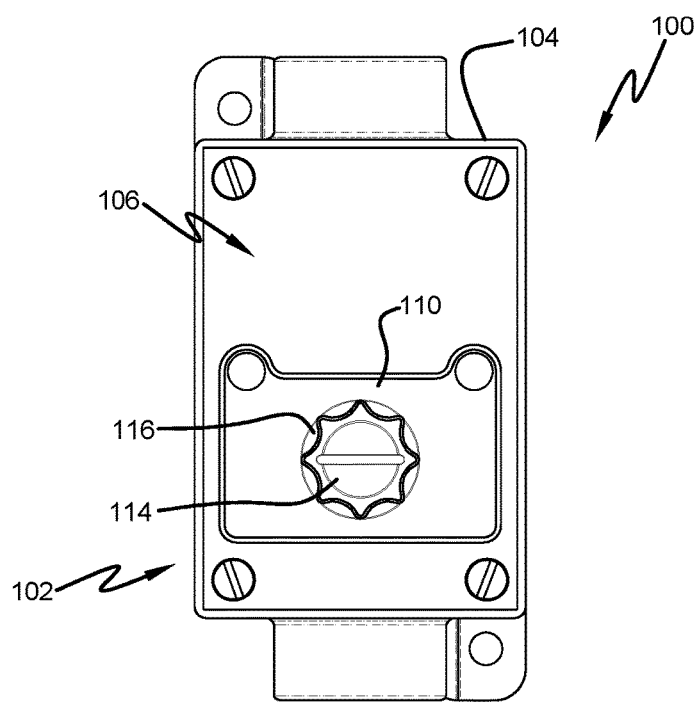
FIG. 1 is a perspective view of an industrial enclosure equipped with nested, magnetic controls according to various embodiments of the disclosure.
Figures 2, 3:
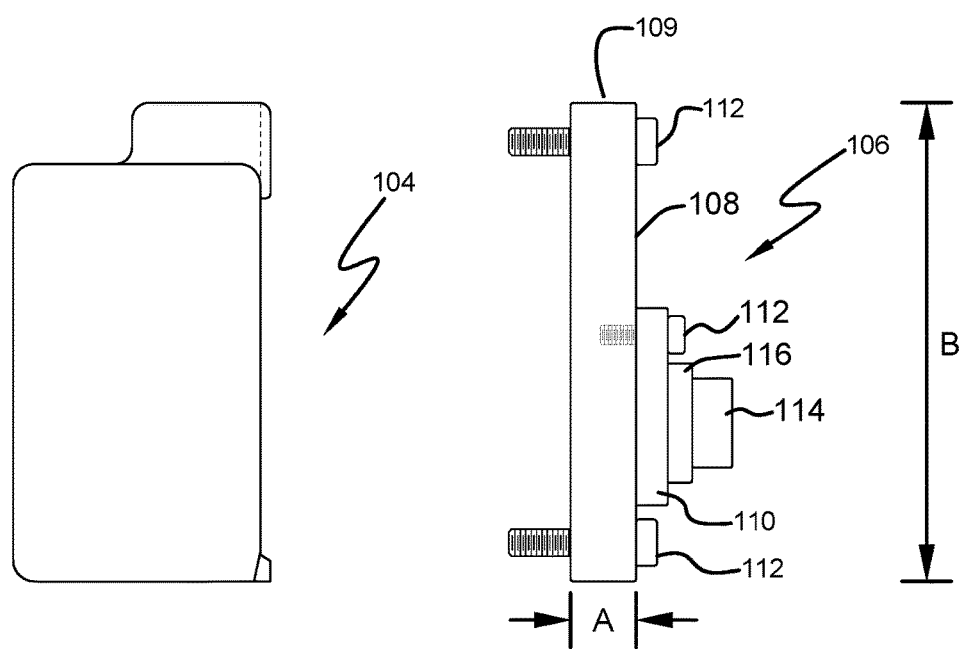
FIG. 2 is a side view of the body of the industrial enclosure of FIG. 1.
FIG. 3 is a side view of the cover of the industrial enclosure of FIG. 1.

Referring to FIG. 1 an industrial enclosure 100 is equipped with nested, magnetic controls 102 is illustrated. A side view of the body 104 of the industrial enclosure 100 is illustrated in FIG. 2. In one example embodiment, the body 104 of the industrial enclosure 100 may comprise a commercially available body such as those provided with the explosion proof EDS/EFS Series Control Stations available from Crouse-Hinds which are typically made of a FERALOY® iron alloy or a copper-free aluminum. The body 104 of the industrial enclosure 100 may vary in size as appropriate to the application. However, by way of example with reference to the EDS/EFS bodies, the dimensions of the body 104 of the enclosure 100 are approximately six inches in height by three and a-half inches in width and two to three inches in depth.

The cover 106 of the industrial enclosure 100 comprises a face plate 108 and a flange 109, where the cover 106 has a depth A, a height B, and width C (see, FIG. 1) that is configured to interface with the body 104 of the enclosure; a side view of the cover 106 is illustrated in FIG. 3. A mounting plate 110, to which the nested, magnetic controls 102 are secured, is attached to the cover 106. The nested, magnetic controls 102 may be secured to the mounting plate 110 with a series of bolts (not shown) threaded into the cover, or through another appropriate mechanical means.

Notably, the mounting plate 110 and the nested, magnetic controls 102 are secured to the industrial enclosure 100 without penetrating the interior walls of the enclosure. In an example where the industrial enclosure 100 is an explosion proof enclosure, the absence of penetration means that no additional design considerations must be given to flame paths. In the conventional design of explosion proof enclosures, all penetrations through the enclosure are considered flame paths. This includes the threads within the cover for the device, and the orifices in the devices for the actuations of shaft assemblies, etc., and even the hubs for connection of electrical conduit. The present design eliminates the flame paths between the enclosure and cover, and within the enclosure, improving safety, ingress protection, and reliability in hazardous environments.

In one example embodiment, the face plate 108 and mounting plate 110 are fabricated from a copper-free aluminum while the screws 112 connecting the cover 106 to the body 104, and connecting the mounting plate 110 to the cover 106, are stainless steel. In another example embodiment, that of an explosion proof enclosure, the body 104 and the cover 106 each include accurately ground wide flanges for a flame-tight joint.

Figure 4:
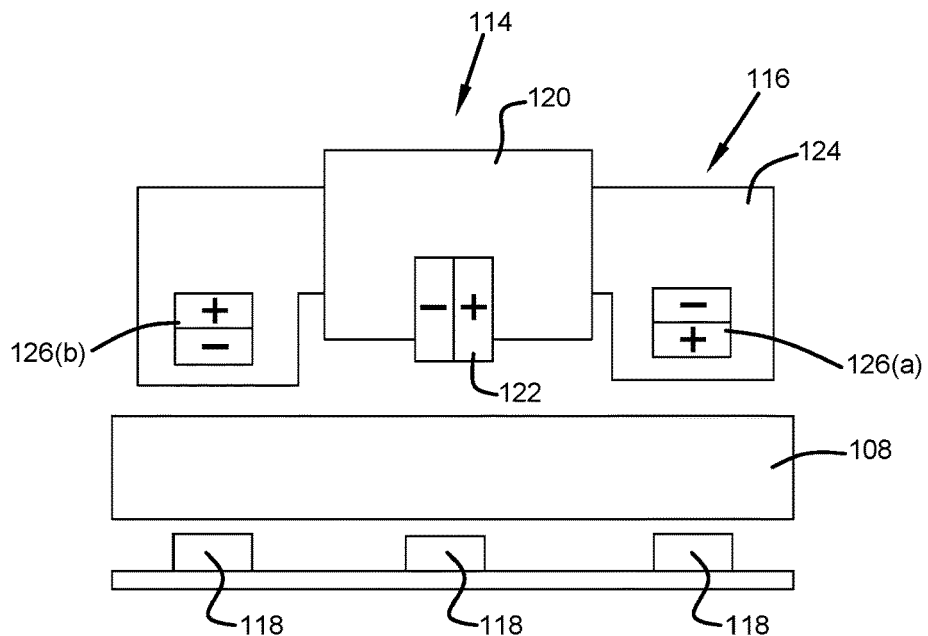
FIG. 4 is a cross section of the nested, magnetic controls of FIG. 1.

A cross section of the nested, magnetic controls 102, relative to the cover 106, is provided in FIG. 4. As shown, the nested, magnetic controls 102 generally comprise a magnetized inner dial 114 nested within a magnetized outer dial 116 and a plurality of sensors 118. The magnetized inner dial 114 comprises a rotatable housing 120 including a diametric cylindrical magnet 122 polarized with a positive (+) and negative (−) side as shown. The magnetized inner dial 114 is configured with a continuous 360 deg. rotational ability and essentially functions as a magnetized potentiometer. In alternative embodiments, the rotatable inner dial 114 may be replaced with a key switch, a push button (a "plunging" control), joystick, or combination there, e.g., a rotatable control that may be pushed down whereby any appropriate inner control (magnetic or non-magnetic) is surrounded by an outer rotatable magnetic control, e.g., magnetized outer dial 116.

The magnetized outer dial 116 comprises a rotatable housing 124 having an outer concentric configuration relative to the magnetized inner dial 114. The rotatable housing 124 includes two axially magnetized magnets 126a and 126b having opposite positive (+) and negative (−) polarization as shown. The magnets 126a and 126b are placed opposite one another within the housing 124. In one example embodiment, the magnetized outer dial 116 is configured as a selector switch having eight detent enabled positions. Other configurations of the outer magnetized dial 116, such as continuous 360 degree rotation, greater or lesser number of detents, etc., are also deemed part of the present disclosure. Further, in an alternative embodiment, the sensors 118 configured within the dials 114, 166 while the magnets 122, 126a, 126b are in a fixed position below the sensors 118. The magnets 122, 126a, and 126b, may comprise, but are not limited to rare earth magnets of Neodymium, Iron and Boron. The magnets 122, 126a, 126b, may further include coatings to protect them from the environment. Such coatings may include nickel, copper, tin, zinc, epoxy, silver, gold, or rubber.

Figure 5:
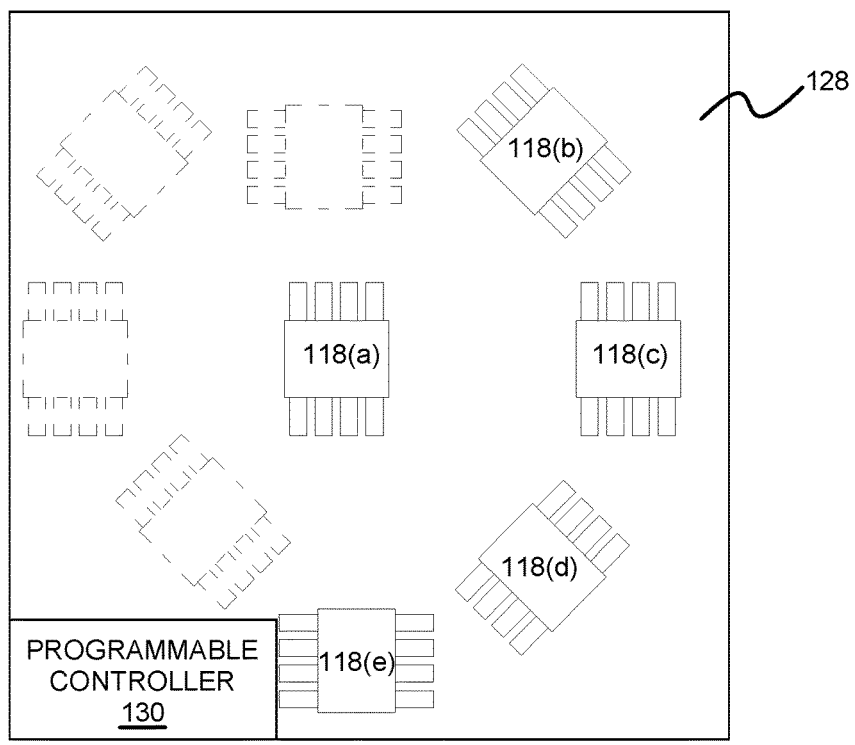
FIG. 5 illustrates an example of a circuit board configured to interface with the nested, magnetic controls of FIG. 1.

The sensors 118 are each configured to detect magnetic flux density along three axes, e.g., x-axis, y-axis, and z-axis. In an example embodiment, each of the sensors 118 comprises a TRIAXIS® Magnetometer IC (integrated circuit), e.g., MLX90363, available from Melexis. Suitable to the eight detent switch configuration described above, at least five sensors 118(a)-118(e) are provided and are arranged in a substantially radial configuration as shown in FIG. 5. In one example embodiment, the sensors 118(a)-118(e) are mounted to a circuit board 128 that is positioned within the flange 109 depth of the cover 106 such that sensor 118(a) is behind the cover 106 and beneath the magnetized inner dial 114. Similarly, positioning the circuit board 128 within the flange 109 of the cover 106 places sensors 118(b)-118(e) behind the cover 106 such that they may lie beneath magnets 126(a) and 126(b) of the magnetized outer dial 116. The circuit board 128 is additionally provided with a programmable controller 130, e.g., processor, microprocessor, FPGA (field programmable gate array) that is configured to operate on the output signals provided by each of the sensors 118(a)-118(e). The circuit board 128 is powered by a low system voltage (not shown).

Notably, only four radially positioned sensors 118(b)-118(e) are necessary for an eight detent position switch as, no matter the switch position, at least one of the magnets 126(a) or 126(b) will be positioned over one of the sensors 118(b)-118(e). Note that the opposite polarity of magnets 126(a) and 126(b) enables one to determine which hemisphere of the magnetic outer dial 116 is over each of the sensors 118(b)-118(e). Of course, a greater number of radially positioned sensors 118 could be used, if desired, at increased cost. When configuring other types of rotatable switches, a lesser or greater number of sensors 118 may be used as appropriate. Further, the switches may include additional positions, which may require additional magnets. Of note is that the number of sensors is substantially less than the number of positions by arrangement of the magnets.

Figure 6:
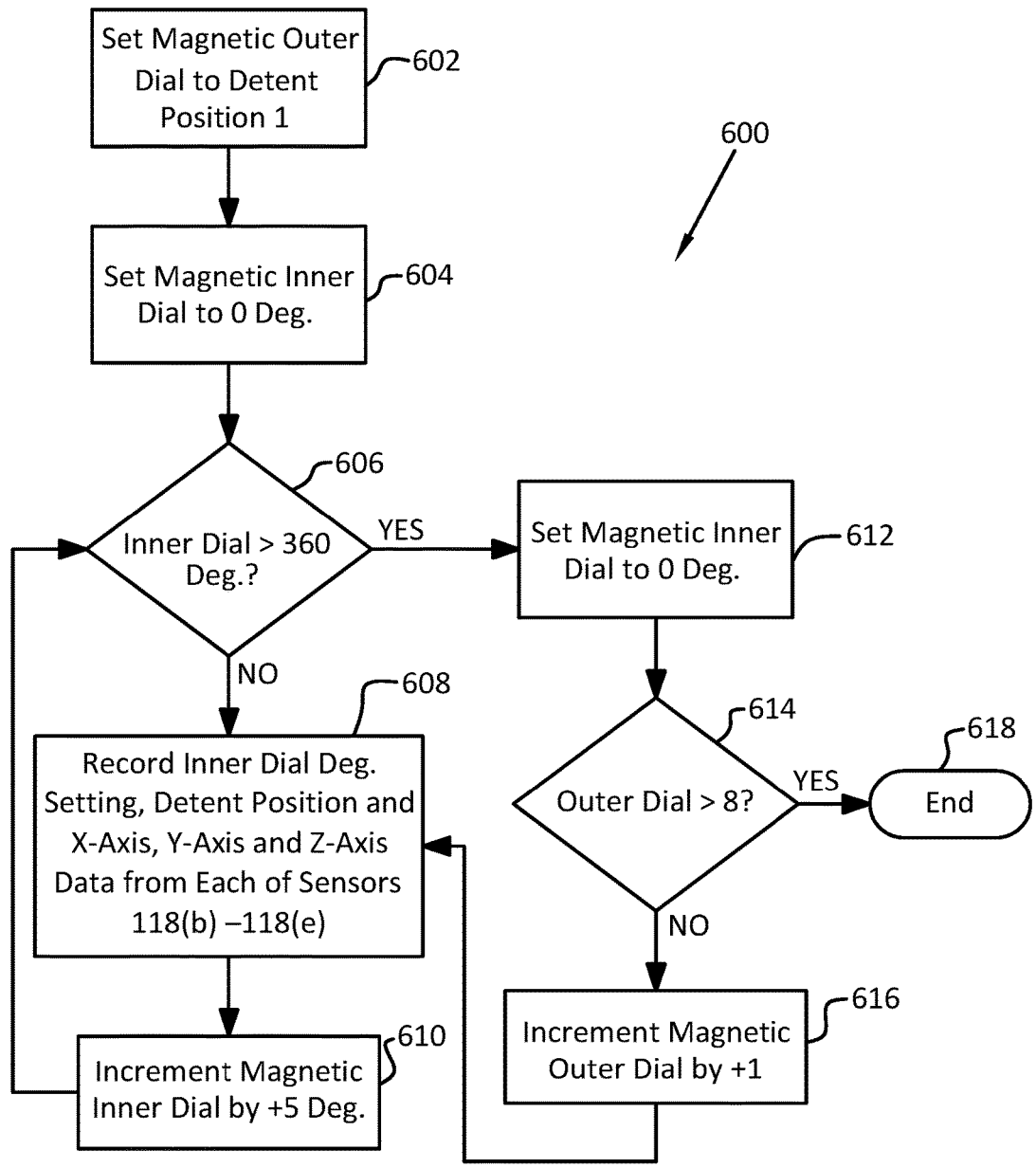
FIG. 6 is a flow chart illustrating an example calibration method for the nested, magnetic controls of FIG. 1

To use the nested, magnetic controls 102 within the industrial enclosure 100 as described above, the controls 102 must first be calibrated with the knowledge that the close positioning of the magnets 122, 126(a) and 126(b) may create magnetic flux density interference. In an example embodiment, the magnetic interference issue may be dealt with by a data point calibration method 600 illustrated in FIG. 6.

The calibration 600 begins by setting the magnetic outer dial 116 to detent position 1 602 and the magnetic inner dial 114 to 0 deg. 604. A query 606 determines if the magnetic inner dial is at a position greater than 360 deg. If not, the position of the magnetic inner dial 114, the detent position of the magnetic outer dial 116, as well as the x-axis, y-axis, and z-axis outputs from each of the sensors 118(d) and 118(e) is recorded 606 in a data table within programmable controller 130. Subsequently, the degree setting of the magnetic inner dial 114 is increased by +5 deg., 610, and control is returned to query 606.

If query 606 determines that the degree reading of the magnetic inner dial 114 has surpassed 360 deg., then the position/value of the magnetic inner dial is reset to 0 deg. 612. Subsequently, query 614 determines if the magnetic outer dial detent setting has surpassed a value of 8. If not, the magnetic outer dial detent setting is increased by one 616 and data related to the inner dial degree setting, the outer dial detent setting, as well as the x-axis, y-axis, and z-axis outputs from each of the sensors 118(d) and 118(e) is recorded 608. If the query 614 has determined that magnetic outer dial detent setting has surpassed 8, all desired calibration data has been recorded and the calibration process is ended 618.

In one example embodiment, 576 data points are collected that account for measurements at every five degrees for all eight positions of the outer dial 116, e.g., 72*8=576. Each "data point" actually consists of x, y, and z measurement for the four sensors 118(b)-118(e), providing a total of 6912 pieces of data that may be used in the calibration.

In use the magnetic inner dial 114 may be used to change a setting value while the magnetic outer dial 116, having eight detent positions, may use one or all eight detent positions to select the setting to change. During run-time of the nested, magnetic controls 102, the programmable controller 130 is configured to perform a look-up in the data from the four sensors. A mean squared error calculation is performed by the programmable controller 130 from the sensor reading for all eight detent positions. The position with the lowest means squared error is considered to be the detent position of the magnetic outer dial 116.

More specifically, the inner dial 114 value is used as an input to a lookup table. The output of the lookup table is a data set consisting of x, y, and z values for all four sensors 118(b)-118(e), for all eight possible sensor positions (96 total values). Note that because the angle of the internal dial 114 affects the values read at the sensors 118(b)-1118(e), the values for the eight possible sensor positions in each of the 5 degree increments of the inner dial 114 are stored. The current values that are being measured are the x, y, and z for the four sensors 118(b)-118(e). The current x of each sensor is compared to the x of the corresponding sensor from the data set (for the current inner dial position), which gives 32 different error values (4 sensors times 8 positions). The same operation is performed on y and z, for a total of 96 error values. The 12 error values per outer dial position (x, y, and z, for sensors 118(b)-118(e)) are each squared, and an average is taken, resulting in a single positive value per outer dial position. The position that has the lowest error value is selected as the current position.

An example equation for calculating the mean squared error for an x-axis reading is provided below in Equation (1). Similar equations are used for y and z readings.

$$MSE = \frac{1}{n}\Sigma_{i=1}^{n}(x_i - \tilde{x}_i)^2 \qquad \text{Eq. (1)}$$

Where: $n$ = the number $y$ data points $$x_i = \begin{vmatrix} x_i \\ y_i \\ z_i \end{vmatrix} \text{(The value read by sensor } i\text{)}$$

$$\tilde{x}_i = \begin{vmatrix} \tilde{x}_i \\ \tilde{y}_i \\ \tilde{z}_i \end{vmatrix} \text{(The stored values for sensor } i\text{)}$$

Once the detent position of the magnetic outer dial 116 is determined the operation assigned to the detent position may be activated/initiated by an output from the controller 130.

Of course different calibration methods and different run-time switch position determination methods that are known to those in the art, e.g., neural nets, baeysian classifiers, etc., may be used in place of the above-described data point calibration method and mean squared error switch position determination method, and are deemed part of the present disclosure.

The above-described nested, magnetic controls for an industrial enclosure provide the user with multi-functional controls in a small footprint. With regard to explosion proof industrial enclosures, the nested, magnetic controls provide significantly more and complex interface options than has previously been available in Class I, Division 1 and Division 2 locations. Numbers of explosion proof enclosures utilizing simplified, one-action (e.g., push button, rocker switch) controls may now be replaced with a single explosion proof enclosure incorporating nested, magnetic controls.

Systems, devices or methods disclosed herein may include one or more of the features, structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality.

Various modifications and additions can be made to the disclosed embodiments discussed above. Accordingly, the scope of the present disclosure should not be limited by the particular embodiments described above, but should be defined only by the claims set forth below and equivalents thereof.

What is claimed:

1. A system comprising:
   an industrial enclosure having a cover, the cover having an outer surface and an inner surface opposite the outer surface;
   a first magnetic control including a first rotatable dial, the first rotatable dial including at least a first magnet; and
   a second magnetic control nested within the first magnetic control, the second magnetic control including a second rotatable dial including at least a second magnet, wherein in operation the first and second rotatable dials are independently rotatable relative to each other about a central axis of rotation, wherein the second magnet rotates about the central axis of rotation and moves relative to the first magnet when the second rotatable dial is rotated about the axis of rotation, wherein the first magnet orbits around the second magnet and around the central axis of rotation when the first rotatable dial is rotated about the central axis of rotation, and wherein the first and second magnetic controls are secured to the outer surface of the cover,
   wherein the first and second magnetic controls are secured to the outer surface of the cover without penetrating the inner surface of the cover.

2. The system of claim 1, wherein the industrial enclosure is configured for use in hazardous environments.

3. The system of claim 1, wherein the system includes a third magnet, wherein the third magnet is carried with the first rotatable dial, wherein the first and third magnets concurrently orbit about the second magnet when the first rotatable dial is rotated about the central axis of rotation.

4. The system of claim 3, wherein the first and third magnets are positioned on diametrically opposite sides of the central axis of rotation.

5. The system of claim 4, further comprising a sensor arrangement for sensing magnetic flux emitted by the first and second magnetic controls, the sensor arrangement including a first sensor at the central axis of rotation and a plurality of second sensors spaced circumferentially relative to one another about the central axis of rotation, and wherein the first rotatable dial includes a plurality of rotational detent positions.

6. The system of claim 1, further comprising a plurality of sensors configured to sense a magnetic flux density emitted by the first and second magnetic controls.

7. The system of claim 6, wherein the plurality of sensors are contained with the industrial enclosure proximate the cover.

8. The system of claim 7, wherein the plurality of sensors include a first sensor at the central axis of rotation and a plurality of second sensors spaced circumferentially relative to one another about the central axis of rotation.

9. The system of claim 8, wherein the first magnetic control has at least two axially magnetized magnets positioned diametrically opposite one another, and wherein one of the at least two axially magnetized magnets is the first magnet.

10. The system of claim 9, wherein the at least two axially magnetized magnets have oppositely configured poles.

11. The system of claim 6, wherein the plurality of sensors are configured to sense three components (x, y, and z) of the magnetic flux density.

12. The system of claim 11, further comprising a programmable controller contained within the industrial enclosure and configured to operate on the sensed three components of the magnetic flux density to determine a position of the first magnetic control.

13. The system of claim 1, wherein the second magnet is a centrally positioned diametric cylindrical magnet.

14. A system comprising:
   an industrial enclosure having a cover with an outer surface and an inner surface;
   a first rotatable magnetic control configured to emit a first magnetic flux density;
   a second rotatable magnetic control configured to emit a second magnetic flux density, the second rotatable magnetic control nested within the first magnetic control, wherein the first and second rotatable magnetic controls are secured to the outer surface of the cover without penetrating the inner surface; and
   a plurality of sensors contained within the industrial enclosure and configured to sense the first and second magnetic flux densities, wherein the sensed first and second magnetic flux densities are representative of a position of the first rotatable magnetic control, the second rotatable magnetic control, or of both the first and second rotatable magnetic controls; and
   wherein the first and second rotatable magnetic controls respectively include first and second dials which respectively emit the first and second magnetic flux densities, the first and second dials being independently rotatable relative to one another about a central axis of rotation, and wherein the first and second dials can be independently rotated to selected rotational positions relative to one another to allow a desired control setting to be selected.

15. The system of claim 14, wherein the position of the first magnetic control, the position of the second magnetic control or the positions of both the first and second magnetic controls are configured to initiate a control operation.

16. The system of claim 14, wherein the wherein the plurality of sensors includes a first magnetic flux density sensor at the central axis of rotation, and a plurality of second magnetic flux density sensors circumferentially spaced with respect to one another about the central axis of rotation.

17. The system of claim 14, wherein the plurality of sensors are configured to sense any of three components (x, y, and z) of the first and second magnetic flux density.

18. The system of claim 14, further comprising a controller configured to operate on the sensed first and second magnetic flux densities to determine a position of the first magnetic control, the second magnetic control or both of the first and second magnetic control.

19. The system of claim 14, wherein the first magnetic control has at least two axially magnetized magnets positioned diametrically opposite one another.

20. The system of claim 19, wherein the at least two axially magnetized magnets have oppositely configured poles.

21. The system of claim 14, wherein the second magnetic control has a centrally positioned diametric cylindrical magnet.

22. A system comprising:
an industrial enclosure having a cover, the cover having an outer surface and an inner surface opposite the outer surface;
a single-magnet control nested within a dual-magnet control, each of the magnets configured to emit a magnetic flux density, the nested magnetic controls secured to the outer surface of the cover without penetrating the inner surface, the single-magnet control being rotatable about a central axis of rotation relative to the dual-magnet control to change a setting of the system, and the dual-magnet control being rotatable about the central axis of rotation relative to the single-magnet control to change the setting of the system, wherein the single-magnet control and the dual-magnet control are secured to the outer surface of the cover without penetrating the inner surface of the cover; and
a sensor to sense the magnetic flux density emitted by the magnet of the single-magnet control and to sense the magnetic flux density emitted by one or both of the magnets of the dual-magnet control, wherein the sensor is contained within the enclosure and is configured to produce an output representative of the sensed magnetic flux density;
a programmable controller configured to operate on the output of the sensor to determine a position of at least one of the single-magnet control or the dual-magnet control and configured to initiate a control operation based on the determined position.

23. The system of claim 22, wherein the sensor is part of a sensor arrangement including a first magnetic flux density sensor positioned at the central axis of rotation in alignment with the single-magnet control, and wherein the sensor arrangement also includes a plurality of second magnetic flux density sensors spaced circumferentially relative to one another about the central axis of rotation.

24. The system of claim 22, wherein the dual-magnet control includes detent positions corresponding to the second magnetic flux density sensors.

25. A system comprising:
a first magnetized dial that is rotatable about a central axis of rotation;
a second magnetized dial that is rotatable about the central axis of rotation, the first and second magnetized dials being independently rotatable relative to each other about the axis of rotation, the second magnetic dial being nested within the first magnetic dial; and
an arrangement of magnetic flux density sensors for sensing rotational positioning of the first and second magnetized dials;
a controller that interfaces with the magnetic flux density sensors for determining the rotational positioning based on magnetic flux density readings received from the magnetic flux density sensors, wherein the first and second magnetized dials can be independently rotated to selected rotational positions relative to one another to allow a desired control setting to be selected; and
an industrial enclosure, wherein the magnetic flux density sensors and the controller are positioned inside the industrial enclosure and the first and second magnetized dials are positioned outside the industrial enclosure.

26. The system of claim 25, wherein the first magnetized dial includes at least two magnets.

27. The system of claim 26, wherein the magnets are positioned on diametrically opposite sides of the central axis of rotation and arrange arranged with opposite polarities.

28. The system of claim 25, wherein second magnetized dial includes a single centrally positioned diametric cylindrical magnet.

29. The system of claim 25, wherein the magnetic flux density sensors include a central magnetic flux density sensor in alignment with the second magnetized dial and a plurality of circumferential magnetic flux density sensors spaced circumferentially about the central magnetic flux density sensor.

30. A system comprising:
a first magnetized control;
a second magnetized control that is nested within the first magnetic control, the first and second magnetized controls being independently moveable relative to each other such that the first magnetized control is moveable relative to the second magnetized control between a plurality of first control positions and the second magnetized control is moveable relative to the first magnetized control between a plurality of second control positions; and
an arrangement of magnetic flux density sensors for sensing positioning of the first and second magnetized controls;
a controller that interfaces with the magnetic flux density sensors for determining the positioning of the first and second magnetized controls based on magnetic flux density readings received from the magnetic flux density sensors, wherein the first and second magnetized controls can be independently moved relative to one another to selected ones of the first and second control positions to allow a desired control setting to be selected; and
an industrial enclosure, wherein the magnetic flux density sensors and the controller are positioned inside the industrial enclosure and the first and second magnetized controls are positioned outside the industrial enclosure.

31. The system of claim 30, wherein the first magnetic control is a magnetized first rotary dial.

* * * * *